(12) United States Patent
Iechi et al.

(10) Patent No.: US 7,420,204 B2
(45) Date of Patent: *Sep. 2, 2008

(54) ORGANIC TRANSISTOR

(75) Inventors: Hiroyuki Iechi, Kanagawa (JP);
Yoshikazu Akiyama, Kanagawa (JP);
Hiroshi Kondoh, Kanagawa (JP);
Takanori Tano, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 99 days.

This patent is subject to a terminal disclaimer.

(21) Appl. No.: 11/472,597

(22) Filed: Jun. 21, 2006

(65) Prior Publication Data

US 2006/0243971 A1    Nov. 2, 2006

Related U.S. Application Data

(63) Continuation of application No. 10/320,021, filed on Dec. 16, 2002, now Pat. No. 7,126,153.

(30) Foreign Application Priority Data

Dec. 17, 2001  (JP) .............................. 2001-383624

(51) Int. Cl.
*H01L 29/72* (2006.01)
(52) U.S. Cl. .............................. 257/40; 257/41; 257/43; 257/50; 257/90; 257/94; 257/102; 257/103
(58) Field of Classification Search .................. 257/40, 257/41, 43, 50, 90, 94, 102, 103
See application file for complete search history.

(56) References Cited

U.S. PATENT DOCUMENTS

| 4,883,766 A | 11/1989 | Ishida et al. |
| 5,061,974 A | 10/1991 | Onodera et al. |
| 5,294,815 A | 3/1994 | Iechi |
| 5,362,673 A | 11/1994 | Iechi |
| 5,555,219 A | 9/1996 | Akiyama et al. |

(Continued)

FOREIGN PATENT DOCUMENTS

JP    10270712    10/1998

(Continued)

OTHER PUBLICATIONS

K. Kudo et al. (1998) "Schottky gate static induction transistor using copper phthalocyanine Films", Thin Solid Films, 331, pp. 51-54.

(Continued)

*Primary Examiner*—Edward Wojciechowicz
(74) *Attorney, Agent, or Firm*—Cooper & Dunham, LLP

(57) ABSTRACT

An organic transistor is capable of emitting light at high luminescence efficiency, operating at high speed, handling large electric power, and can be manufactured at low cost. The organic transistor includes an organic semiconductor layer between a source electrode and a drain electrode, and gate electrodes shaped like a comb or a mesh, which are provided at intervals approximately in the central part of the organic semiconductor layer approximately parallel to the source electrode and the drain electrode. The organic semiconductor layer consists of an electric field luminescent organic semiconductor material such as compounds of naphthalene, anthracene, tetracene, pentacene, hexacene, a phthalocyanine system compound, an azo system compound, a perylene system compound, a triphenylmethane compound, a stilbene compound, poly N-vinyl carbazole, and poly vinyl pyrene.

4 Claims, 5 Drawing Sheets

U.S. PATENT DOCUMENTS

| | | | |
|---|---|---|---|
| 5,610,853 | A | 3/1997 | Akiyama et al. |
| 5,684,523 | A | 11/1997 | Satoh et al. |
| 5,729,262 | A | 3/1998 | Akiyama et al. |
| 5,835,837 | A | 11/1998 | Saitoh et al. |
| 5,900,336 | A | 5/1999 | Kabata et al. |
| 6,068,953 | A | 5/2000 | Matsumoto et al. |
| 6,391,471 | B1 * | 5/2002 | Hiraoka et al. .............. 428/623 |
| 6,414,732 | B1 | 7/2002 | Matsumoto et al. |
| 6,493,529 | B1 | 12/2002 | Umemura et al. |
| 6,559,473 | B1 * | 5/2003 | Yu et al. ...................... 257/40 |
| 2003/0015698 | A1 * | 1/2003 | Baldo et al. ................... 257/40 |

OTHER PUBLICATIONS

K. Kudo et al. (2000) "Organic static induction transistor for display devices", Syntheric Metals, 111-112, pp. 11-14.

K. Ikegami et al. (2000-05) "Fabrication of hybrid organic ekectrikuminescence transistor", Technical Report of IEICE, OME2000-20, pp. 47-51.

S. Kuniyoshi et al. (Jul. 2000) "Space-Charge Conduction in a Copper Phthalocyanien Static Induction Transistor", IEICE Trans. Electron., vol. E83-C, No. 7, pp. 1111-1113.

K. Ikegami et al. (2001) "Hybrid orgainc light emitting transistor", Technical Report of IEICE, EID2000-323, OME2000-172, pp. 1-5.

"Low-Cost all-polymer Integrated Circuits," C.J. Drury et al., Appl. Phys. Lett. vol. 73, No. 1, 1998, pp. 108-110.

Device operating of Schottky Gate Type Static Induction Transistor Using Copper-Phthalocyanine Evaporated Films, Dong Xing Wang et al., T.IEEE Japan, vol. 118-A, No. 10.

U.S. Appl. No. 09/609,900.

* cited by examiner

ORGANIC TRANSISTOR

CROSS-REFERENCE TO RELATED APPLICATION

This application is a Rule 1.53(b) Continuation of U.S. Ser. No. 10/320,021, filed Dec. 16, 2002 now U.S. Pat. No. 7,126,153, the entire contents of which are incorporated by reference herein.

BACKGROUND OF THE INVENTION

1. Field of the Invention

The present invention generally relates to an organic transistor, and especially relates to an organic electro luminescent (EL) transistor that is useful as a self-luminous organic EL display, and capable of switching and luminescence functions by combining an organic light emitting diode (LED) and an organic transistor.

2. Description of the Related Art

In recent years, research has actively been carried out about organic EL elements because it has become clear that the organic EL elements are superior to luminous devices that deploy inorganic materials for reasons such as (1) a lightweight structure can be provided, (2) a wide area display can be easily obtained, and (3) various luminescences can be obtained. An organic EL display using an organic EL element provides high luminosity with a thin shaped configuration and a fast response speed, and is therefore considered to be a promising next-generation display device that will replace liquid crystal displays that are presently used. Further, an organic semiconductor material is attracting attention as a material to replace amorphous silicon or poly silicon in TFTs (thin film transistors) that are used as display driving (controlling) devices.

Research of organic transistors has been actively conducted since the beginning of the 1980s, and fundamental characteristics of low molecular and high polymer organic compounds for semiconductor film have been studied. However, because an organic semiconductor material as above has lower electric charge transfer speed and higher resistance than an inorganic semiconductor material, the organic semiconductor material has seldom attracted attention for practical applications. Starting recently, research of organic semiconductor materials is being actively conducted for application to a wide area display element of the next generation, so that present liquid crystal displays, which are often used in portable electric devices, can be replaced with displays using organic material that features lightweight and flexibility. For example, TFT that is formed with a pentacene film on a highly doped silicon substrate, which realizes electric charge transfer speed of 0.52 cm2/V-sec, is proposed (JP,10-270712,A).

TFT formed with pentacene has shown problems in that vacuum membrane formation is required to form pentacene into a thin film, and that adhesion of pentacene to a substrate is weak. Then, C. J. Drury et al. proposed a totally-organic TFT that employed polyimide for the substrate, poly vinyl phenol (PVP) as an insulated material, poly thienylenevinylene (PTV) as a semiconductor material, and doped poly aniline as an electrode material, which realizes an electric charge transfer speed of 3×10-4 cm2/V-sec (APL Vol. 73, No. 1 (1998) 108).

However, the electric charge transfer speed attained by the TFT proposed by J. Drury et al. is still low, and improvements are desired. From these facts, it has become important that improvements be based on total technology. That is, in order to attain an electric charge transfer speed comparable to amorphous silicon, the technology of TFT structures and the technology of TFT production processes have to be added to the technology concerning organic semiconductor material.

As for organic semiconductor materials, for example, (1) low molecular compounds such as pentacene and metal phthalocyanine, (2) short chain oligomers such as $C_3$-$C_8$ n-thiophene, and (3) long chain polymers such as poly thiophene and poly phenylenevinylen are available. The long chain polymer is known as a π-conjugate system conductive polymer, wherein an electric charge moves along a low molecular compound, an oligomer, and a polymer by conjugation of atomic orbits between adjacent atoms that are multimeric. Depending on the conjugation status of orbits of adjacent molecules, electron transfer between the molecules becomes possible. An organic thin film of a low molecular compound or a short chain oligomer is known to show the highest degree of charge transfer among organic materials, and the low molecular compound or the short chain oligomer that shows such a high degree of charge transfer is made into an ordered arrangement, and formed into a thin film by vacuum evaporation. In the ordered arrangement of the thin film, atomic orbits overlap, which overlap is considered to facilitate the transfer of an electric charge between adjoining molecules. A long chain polymer that has great solubility provides a low cost film by spin-coating and dip-coating, which certainly is an advantage. However, a problem is that the electric charge transfer speed is low because the ordered arrangement is not available. Thus, an organic semiconductor material that has sufficiently high electric charge transfer speed has not been found.

As mentioned above, while an organic semiconductor material offers a possibility that TFT will be realizable with cheaper and easier membrane formation technology, such as vacuum evaporation, spin-coating, dip-coating, printing, and ink jetting, which is an advantage, there is a problem in that the electric charge transfer speed is lower than desired. Typical electric charge transfer speed is 0.001-0.1 cm2/V-sec in the small molecular compounds and the short chain oligomer, and 0.0001-0.01 cm2/V-sec in the long chain polymer. The highest electric charge transfer speed of an organic semiconductor material reported so far is 0.7 cm2/V-sec of a pentacene thin film.

Under the state of the art as described, even if TFT having an electric field effect transistor (FET) structure is simply employed as a driving unit of an organic EL element, the electric charge transfer speed is still low, and it is difficult to obtain a desired operation speed at desired power consumption.

Another approach is to use an electrostatic induction n-type transistor (SIT) as a switching element that provides comparatively favorable ON current value at a low electric charge transfer speed. SIT is a transistor in which electric current flows vertically through an active layer, while, generally, in TFTs, electric current flows horizontally through an active layer.

FIG. 11 is an outline sectional drawing of a SIT. A SIT generally includes a P+ gate 103 that is inserted in a semiconductor layer 104 that is sandwiched by an N+ source electrode 101 and an N+ drain electrode 102. When voltage is applied to the P+ gate electrode 103, a depletion layer 105 (two regions shown by dotted lines in FIG. 11) expands in the semiconductor layer 104. As the voltage is increased, the two regions grow and touch each other at a certain voltage, which is called the contacting voltage. When the gate voltage is smaller than the contacting voltage, SIT will be in an ON state. In order to turn the SIT to an OFF state, it is necessary to apply a negative voltage between the P+ gate 103 and the N+ source electrode 101 such that the potential level is raised. That is, the current IDS that flows between the N+ source electrode 101 and the N+ drain electrode 102 is a function of the height of a potential barrier produced by the voltage applied to the P+ gate 103 and drain voltage $V_D$. A SIT that operates in this manner is called a normally-ON SIT, which features (1) providing high speed operation because no carrier is injected from the gate, (2) providing high ruggedness (large current can flow) because no current concentration is present, (3) being a voltage driven device, (4) showing an unsaturated current-voltage characteristic, and the like.

As for a SIT using an organic semiconductor, a vertical type TFT is reported (Kudo et al., T.IEE Japan, Vol. 118-A, No. 10, (1998) P1166-1171), wherein copper phthalocyanine (CuPc) is sandwiched by a source electrode and a drain electrode, and a gate electrode consists of slit-like aluminum formed by vacuum evaporation, and embedded in the copper phthalocyanine (CuPc) that is an organic material. All films of this TFT are formed by the vacuum evaporation method on a glass substrate. Further, in order to form a Schottky barrier near the interface of an organic molecule film of CuPc, which is formed by vacuum evaporation, and the slit-like aluminum gate electrode of the SIT, the slit-like aluminum is exposed to the atmosphere immediately after carrying out the vacuum evaporation so that the aluminum surface is oxidized. Problems with this SIT are that: since all the films are formed by the vacuum evaporation method, costs of production equipment becomes high, and, therefore, productivity becomes low; and because the process includes exposure to the atmosphere for oxidizing the metal, control is difficult, and reproducibility is not satisfactory.

SUMMARY OF THE INVENTION

Accordingly, a general object of the present invention is to provide a low cost organic transistor that provides a high speed operation and a high power capability, and another and more specific object of the present invention is to provide a low cost organic EL transistor that provides a high speed operation, a high power capability, and a high luminous efficiency, which substantially obviates one or more of the problems caused by the limitations and disadvantages of the related art.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by the organic EL transistor particularly pointed out in the specification in such full, clear, concise, and exact terms as to enable a person having ordinary skill in the art to practice the invention.

To achieve these and other advantages and in accordance with the purpose of the invention, as embodied and broadly described herein, the present invention provides an organic transistor that includes an organic semiconductor layer between a source electrode and a drain electrode, and gate electrodes that are shaped like a mesh or a comb and provided approximately in parallel with the source electrode and the drain electrode, which face each other, near the center of the organic semiconductor layer. Further, the present invention provides an organic EL transistor that is characterized by the organic semiconductor layer being luminous.

The inventors of the present invention have found that an organic transistor as structured below provides a high operating speed, a high power handling capability, can be manufactured at low cost, and therefore come to complete the present invention. The organic transistor includes a source electrode and a drain electrode that are prepared face to face, an organic semiconductor layer between the source electrode and the drain electrode, and gate electrodes that are shaped like a comb or a mesh, and are provided at intervals from each other approximately in a central part of the organic semiconductor layer, and approximately parallel to the source electrode and the drain electrode. Then, an electric field luminescent organic semiconductor material is used as the organic semiconductor layer, resulting in an organic EL transistor with a high operating speed, high luminescence efficiency, and a high power handling capability, which can be manufactured at a low cost.

DESCRIPTION OF THE PREFERRED EMBODIMENTS

In the following, embodiments of the present invention will be described with reference to the accompanying drawings.

Figure 1:
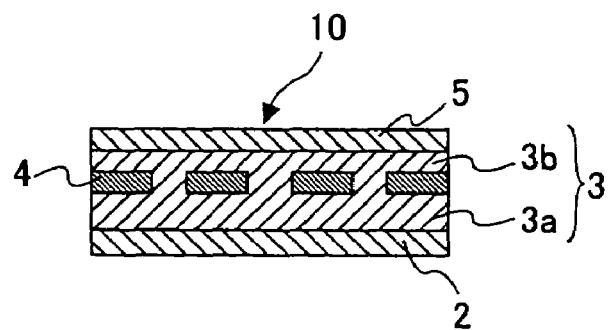
FIG. 1 is a sectional drawing of an organic EL transistor of an embodiment of the present invention.

FIG. 1 shows an organic EL transistor 10 of an embodiment of the present invention. As shown in FIG. 1, the organic EL transistor 10 includes a source electrode 5 and a drain electrode 2 that face each other, an organic semiconductor layer 3 that is provided between the source electrode 5 and the drain electrode 2, and gate electrodes 4 that are parts of a comb-shaped or mesh-shaped electrode unit, adjacent gate electrodes 4 being located at intervals approximately in a central position of the organic semiconductor layer 3, and approximately in parallel with the source electrode 5 and the drain electrode 2. The organic semiconductor layer 3 includes an electric field luminescent (EL) organic semiconductor material.

The organic EL transistor 10 of the present invention, which is vertically arranged into a simple structure, compounding an LED and an organic transistor, is characterized by (1) low operating resistance realized by a short channel length in reference to film thickness, while being able to increase operation speed, current flowing through the short channel, (2) high operation speed and high power handling capability by effectively using the whole electrode surface, (3) capability to provide a high definition full color organic EL display with high luminescence efficiency, and (4) low production cost.

As described above, since the present invention provides the organic semiconductor layer 3 between the source electrode 5 and the drain electrode 2, if a comparatively small voltage is applied to the gate electrodes 4, carriers of the electric charge are driven off and a depletion layer is generated near each of the gate electrodes 4 that are embedded in the organic semiconductor layer 3, the carriers being of an opposite polarity to the voltage applied to the gate electrodes 4. If a comparatively high gate voltage is applied to the gate electrodes 4, the depletion layer generated near the surface of each gate electrode 4 in the organic semiconductor layer 3 expands and is connected with a depletion layer associated with adjoining gate electrodes that are formed in the shape of a comb or a mesh (for example, in a grid pattern), and the current flow between the source electrode 5 and the drain electrode 2 is stopped. That is, by providing the comb or mesh shaped gate electrodes 4 in the organic semiconductor layer 3, the ON/OFF ratio of the transistor is enlarged, and in this manner, the present invention realizes a normally-ON SIT.

The electric field luminescent organic semiconductor material of the present invention preferably contains (1) at least one sort of acene molecule material chosen from naphthalene, anthracene, tetracene, pentacene, hexacene, and derivatives thereof, (2) at least one sort of paint chosen from a phthalocyanine system compound, an azo system compound, a perylene system compound, and derivatives thereof, and (3) at least one sort of low molecular compound chosen from a hydrazone compound, a triphenylmethane compound, a diphenyl methane compound, a stilbene compound, an arylvinyl compound, a pyrazoline compound, a triphenylamine compound, a triarylamine compound, and derivatives thereof, or instead of (3) above, (4) at least one sort of high molecular compound chosen from poly-N-vinyl carbazole, halogenated poly-N-vinyl carbazole, poly vinyl pyrene, poly vinyl anthracene, a pyrene formaldehyde resin, an ethyl carbazole formaldehyde resin, and denaturated materials thereof. In addition, compounds of a fluolenone system, a diphenoquinone system, a benzoquinone system, an anthraquinone system, and an indenone system, a poly tiophene system, and a poly phenylenevinylene system can also be used.

Thus, the organic semiconductor layer of the organic EL transistor of the present invention includes the electric field luminescent organic semiconductor material, and the organic EL transistor serves the switching function and the luminescence function. For this reason, the organic EL transistor can be realized in miniaturized dimensions, and therefore, can be produced economically.

Further, the electric field luminescent organic semiconductor material is formed into an organic semiconductor layer by a manufacturing method chosen from vacuum evaporation, chemistry vacuum evaporation, spin coating, printing, painting and baking, electro polymerization, molecule beam adhesion, self-assembly from a solution, and combinations thereof. For this reason, the present invention that allows adopting simple manufacturing methods realizes a low cost production of the organic EL transistor.

Figure 2:
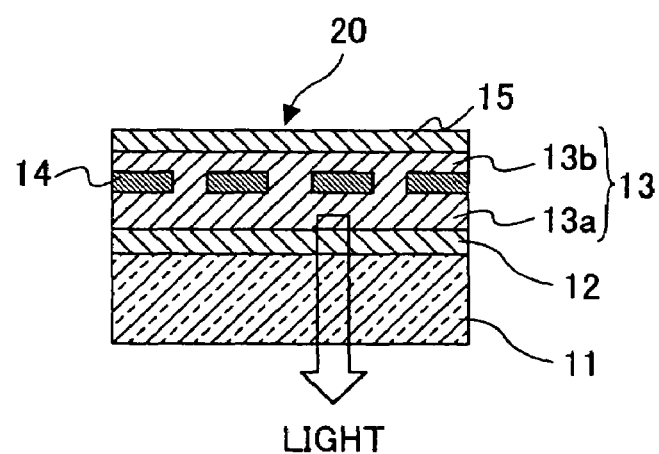
FIG. 2 is a sectional drawing of another organic EL transistor of manufacturing embodiment 1 of the present invention.

The organic EL transistor 20 of the present invention can be structured as shown in FIG. 2, which includes a drain electrode 12, an organic semiconductor layer 13, and a source electrode 15 formed one by one in this sequence on the upper surface of a transparent substrate 11, wherein the drain electrode 12 is made from a transparent electrode material, and the organic semiconductor layer 13 is made from a p-type electric field luminescent organic semiconductor material. The organic EL transistor 20 further includes gate electrodes 14 in the shape of a comb or a mesh (for example, in a grid pattern), each of the gate electrodes 14 being located at intervals to adjacent gate electrodes 14 approximately in the center of the organic semiconductor layer 13 approximately parallel to the source electrode 15 and the drain electrode 12. As for this organic EL transistor 20, the light generated by the organic semiconductor layer 13 is emitted from the transparent substrate 11.

Here, it should be noted that the source electrode and the drain electrode are interchanged according to the conduction type of the organic semiconductor, since the organic semiconductor layer 13 in the present invention serves as both the luminescence layer and the channel layer of the transistor. If the electric conduction type of the organic semiconductor 13 is a p-type, the drain electrode 12 consists of a transparent electrode material, such as ITO, and the source electrode 15 consists of a metal electrode material. To the contrary, if the organic semiconductor layer is constituted from an n-type semiconductor material in the organic EL transistor 20 as shown in FIG. 2, the electrode marked 15 shall be a drain electrode constituted from a metal electrode material, and the electrode marked 12 shall be a source electrode constituted from a transparent electrode material, such as ITO. Thus, from the viewpoint of the organic semiconductor layer (luminescence layer) 13, an electrode that consists of a transparent electrode material, such as ITO, is always an anode, and an electrode that consists of a metal electrode material, is always a cathode.

Figure 5:
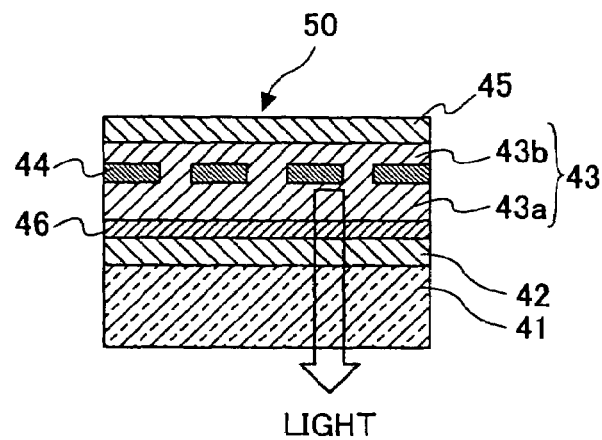
FIG. 5 is a sectional drawing of another organic EL transistor of manufacturing embodiment 4 of the present invention.

Further, FIG. 5 shows an organic EL transistor 50 of the present invention, which includes an electron hole injecting layer 46 that is provided between a drain electrode 42 consisting of a transparent electrode material, such as ITO, and an organic semiconductor layer 43 consisting of a p-type electric field luminescent organic semiconductor material. The organic EL transistor 50 further includes a transparent substrate 41, gate electrodes 44, and a source electrode 45, as shown in FIG. 5. The electron hole injecting layer 46 in the present invention consists of compounds, such as PEDOT and aniline.

Thus, if the electron hole injecting layer 46 is provided between the drain electrode 42 and the organic semiconductor layer 43 that consists of a p-type electric field luminescent organic semiconductor material, the energy barrier between the anode (namely, the drain electrode 42) and a luminescence layer (namely, the organic semiconductor layer 43) can be eliminated. Therefore, according to the present invention, (1) a high speed operation is obtained, with no carrier injection from the gate, (2) a high ruggedness, i.e., large current capability is obtained, with no current concentration occurring, (3) a voltage driven device is obtained, (4) an unsaturated current-voltage characteristic is obtained in a normally-ON mode (a saturation current-voltage characteristic is obtained in a normally-OFF mode).

The reason (detailed theory) is as follows. That is, energy efficiency of luminescence, which is important from a practical viewpoint of a luminescent device, is given by a ratio of output optical energy to electric energy that is input into the luminescent device. In order to evaluate luminescence performance based on the mechanism of luminescence, it is necessary to consider the quantum efficiency of LED luminescence. The quantum efficiency is defined by the number of photons that are emitted per electron or hole (defined by the number of apparent carriers, which is obtained by dividing current that flows in an external circuit by an elementary charge). Here, it is important to clearly distinguish the external efficiency that is relative to the amount of the energy or the number of the photons output from an LED element to the exterior, from the internal efficiency that is relative to the electrical-to-optical conversion process as a physical process. The present invention aims at raising the utilization efficiency of the electric energy that is input to the element, paying attention to the external efficiency. In reference to the process, in which an electron and an electron hole injected from an electrode are converted to a photon in a LED of a single layer structure that uses an organic semiconductor material, and the photon is finally output, a portion of the current that flows through the element (the LED) contributes to carrier re-combination of a pair of an electron and an electron hole, and a part of the re-combined pairs of electrons and electron holes is consumed for generating a luminescent molecular exciton. Only a portion, which is specified by fluorescence quantum efficiency, of the generated excitons is converted into photons, and the remainder disappears in various courses. From these considerations, the luminescence efficiency of an organic semiconductor is enhanced by raising the generation efficiency of the excitons by re-combination of the pairs of an electron and an electron hole, which depends on the balance of electrons and electron holes that are injected.

The organic EL transistor of the present invention realizes balanced injection of electrons and electron holes by devising a laminating structure. The inventors first thought that what is necessary in order to realize the balanced injection of electrons and electron holes is just to make the electric charge transfer speed of the electron and the electron hole equal to each other in the organic semiconductor luminescence layer. However, adjusting the electric charge transfer speed was difficult to realize in a single layer. Then, the balanced injection was realized by adjusting the effective magnitude of the electric field that is applied to the interface of the electrode and the organic semiconductor layer. That is, if the carrier injecting barrier between the electrode and the organic semiconductor layers is lowered, it leads to lowering the voltage to be applied, and if, conversely, the carrier injecting barrier between the electrode and the organic semiconductor layer is raised, it leads to raising the voltage to be applied. Here, the luminescence color of an organic LED is determined by an energy gap Eg that is the difference between HOMO (highest occupied molecular orbital) and LUMO (lowest unoccupied molecular orbital), which is a forbidden bandwidth, of an organic substance.

However, there are cases where luminescence is not necessarily based on the energy transition between HOMO and LUMO. Especially, in the case of a high polymer of a π-conjugated system, Eg is between about 1 and 3.5 eV, covering the visible range. Now, when injecting an electron, it is required that there be no energy barrier between the Fermi level of the cathode and LUMO, and when injecting an electron hole, it is required that there be no energy barrier between the Fermi level of the anode and LUMO. That is, it is required that the work function of the anode be large, and that the work function of the cathode be small. Here, in order to obtain an optical output, a transparent electrode is used. Since ITO (indium tin oxide) is used, ITO is used for the anode. An optically non-transparent material that is hard to be oxidized is used for the cathode. Therefore, the electron hole injecting layer is prepared between the drain electrode and the organic semiconductor layer consisting of a p-type electric field luminescent organic semiconductor material, such that the energy barrier between the anode (namely, the drain electrode) and the luminescence layer (namely, the organic semiconductor layer) is eliminated.

Figure 7:
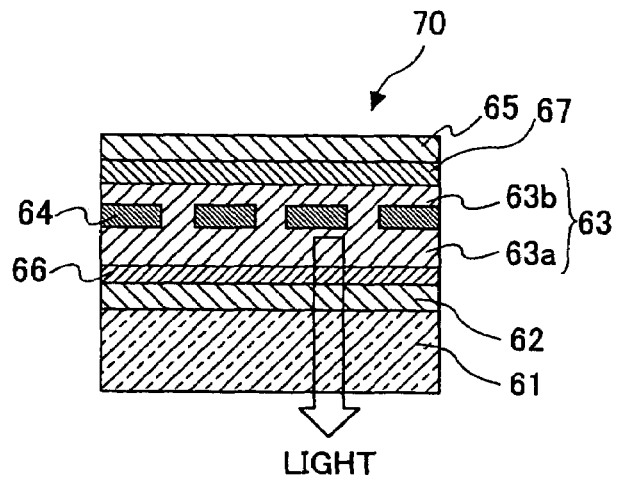
FIG. 7 is a sectional drawing of another organic EL transistor of manufacturing embodiment 6 of the present invention.

Further, FIG. 7 shows an organic EL transistor 70 of the present invention, which includes an electron injecting layer 67 between a source electrode 65 and an organic semiconductor layer 63, which consists of a p-type electric field luminescent organic semiconductor material. The organic EL transistor 70 further includes a transparent substrate 61, a drain electrode 62 consisting of a transparent electrode material, such as ITO, an electron hole injecting layer 66, and gate electrodes 64.

Since the electron injecting layer 67 is formed between the source electrode 65 and the organic semiconductor layer 63 consisting of a p-type electric field luminescent organic semiconductor material in the organic EL transistor 70, electron injection resistance is made low, and, for this reason, large electric power can be handled.

The organic EL transistor of the present invention can be structured with a source electrode, an organic semiconductor layer, and a drain electrode one by one in this sequence on the upper surface of a transparent board, where the source electrode is made of a transparent electrode material, and the organic semiconductor layer is an n-type electric field luminescent organic semiconductor material (not shown). In this organic EL transistor, the light emitted by the organic semiconductor layer is radiated from the transparent substrate (refer to FIG. 2). Further, in this organic EL transistor, an electron hole injecting layer can be inserted between the drain electrode and the organic semiconductor layer, and, further, an electron injecting layer can be inserted between the organic semiconductor layer and the source electrode.

Figure 3:
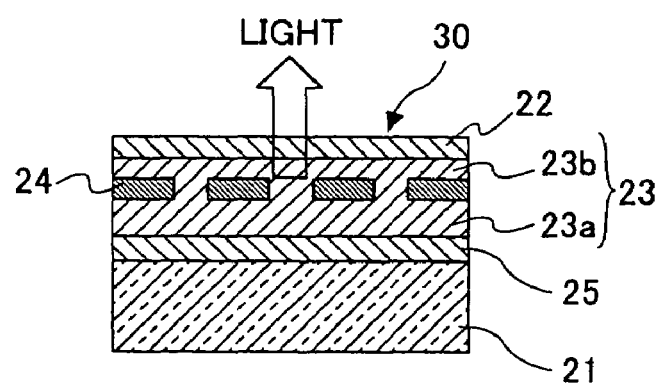
FIG. 3 is a sectional drawing of another organic EL transistor of manufacturing embodiment 2 of the present invention.

FIG. 3 shows an organic EL transistor 30 of the present invention, which includes a source electrode 25, an organic semiconductor layer 23, and a drain electrode 22 formed one by one in this sequence on the upper surface of a substrate 21, where the drain electrode 22 is made from a transparent electrode material, and the organic semiconductor layer 23 is made from a p-type electric field luminescent organic semiconductor material. The organic EL transistor 30, which further includes gate electrodes 24, emits a light from the drain electrode 22.

Figure 6:
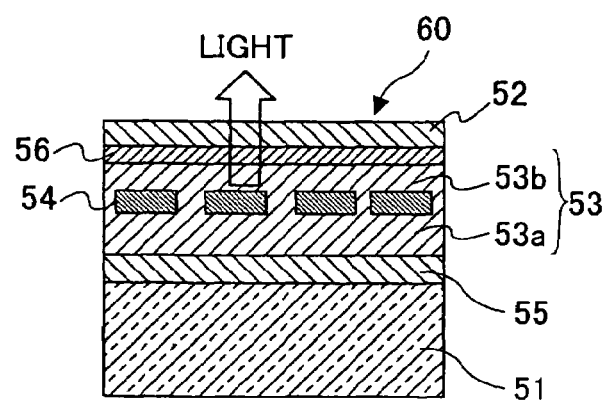
FIG. 6 is a sectional drawing of another organic EL transistor of manufacturing embodiment 5 of the present invention.

Further, FIG. 6 shows an organic EL transistor 60 of the present invention, which includes an electron hole injecting layer 56 that is formed between a drain electrode 52 and an organic semiconductor layer 53 that consists of a p-type electric field luminescence organic semiconductor material. The organic EL transistor 60 further includes a substrate 51, gate electrodes 54, and a source electrode 55 as shown in FIG. 6.

Figure 8:
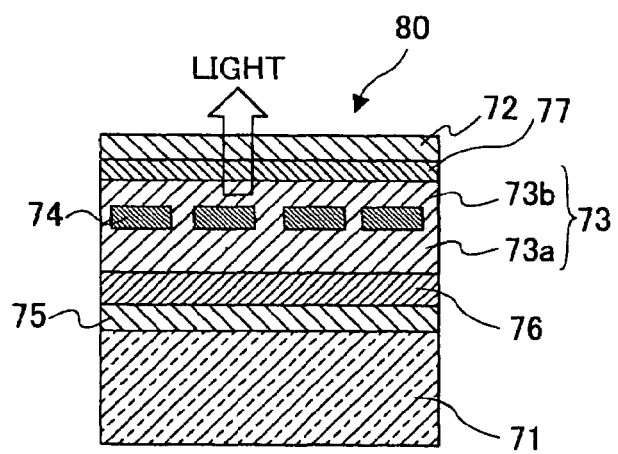
FIG. 8 is a sectional drawing of another organic EL transistor of manufacturing embodiment 7 of the present invention.

Furthermore, FIG. 8 shows an organic EL transistor 80 of the embodiment of the present invention, which includes a source electrode 75, an organic semiconductor layer 73, and a drain electrode 72 formed one by one in this sequence on the upper surface of a substrate 71, where the organic semiconductor layer 73 is made from a p-type electric field luminescent organic semiconductor material, and the drain electrode 72 is made from a transparent electrode material. Further, the organic EL transistor 80 includes an electron injecting layer 77 formed between the drain electrode 72 and the organic semiconductor layer 73, and an electron hole injecting layer 76 formed between the source electrode 75 and the organic semiconductor layer 73.

As a material for the electron injecting layer of the present invention, for example, poly phenylenevinylene (PPV) of the cyano group is used.

The organic EL transistor of the present invention includes the drain electrode, the organic semiconductor layer, and the source electrode formed one by one in this sequence on the upper surface of the substrate, where the source electrode is made from a transparent electrode material, and the organic semiconductor layer is made from an n-type electric field luminescent organic semiconductor material (not shown). Further, in this organic EL transistor, an electron hole injecting layer may be provided between the drain electrode and the organic semiconductor layer, and an electron injecting layer may further be provided between the organic semiconductor layer and the source electrode (not shown).

Figure 9:
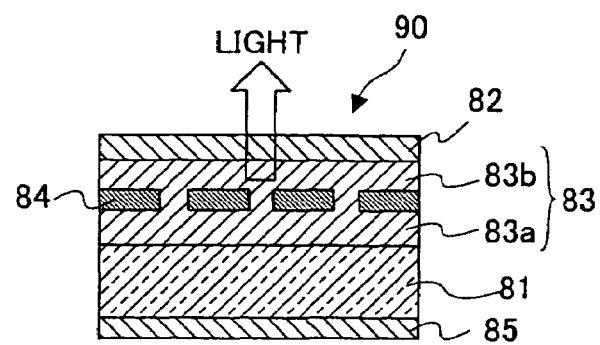
FIG. 9 is a sectional drawing of another organic EL transistor of manufacturing embodiment 8 of the present invention.

FIG. 9 shows an organic EL transistor 90 of the present invention, which includes an organic semiconductor layer 83 and a drain electrode 82 formed one by one in this sequence on the upper surface of a substrate 81, and a source electrode 85 formed on the undersurface of the substrate 81, wherein the drain electrode 82 is made from a transparent electrode material, and the organic semiconductor layer 83 is made from a p-type electric field luminescent organic semiconductor material. The organic EL transistor 90, which emits a light from the drain electrode 82, further includes gate electrodes 84.

Figure 4:
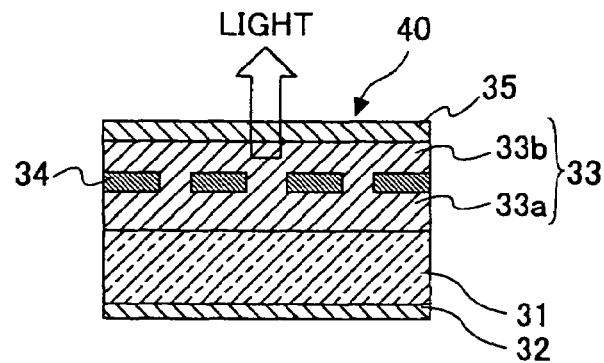
FIG. 4 is a sectional drawing of another organic EL transistor of manufacturing embodiment 3 of the present invention.

FIG. 4 shows an organic EL transistor 40 of the present invention, which includes an organic semiconductor layer 33 and a source electrode 35 formed one by one in this sequence on the upper surface of a substrate 31, and a drain electrode 32 formed on the undersurface of the substrate 31, wherein the source electrode 35 is made from a transparent electrode material, and the organic semiconductor layer 33 is made from an n-type electric field luminescent organic semiconductor material. The organic EL transistor 40, which emits a light from the source electrode 35, further includes gate electrodes 34.

The gate electrodes, source electrode, and drain electrode in the present invention are preferably made from at least one material selected from the group of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), tin (Sn), conductive poly aniline, conductive polypyrrole, conductive poly thiazyl, and conductive polymer, and are formed by a process selected from the group of vacuum evaporation, sputtering, chemical vacuum evaporation, electro deposition, non-electrolyzed plating, spin coating, printing and painting. Here, the gate electrodes are preferably formed by a thin film, the thickness of which is 10 nm or less, and more preferably, between 2 and 3 nm, and each of the source electrode and the drain electrode is preferably formed by a thin film, the thickness of which is between 30 and 500 nm. Further, the transparent electrode of the present invention is made from a transparent electrode material, such as ITO.

The substrate of the present invention is selected from the group of glass, plastic, quartz, undoped silicon, and highly doped silicon. Further, the substrate of the present invention may be a plastic plate, such as polycarbonate, miler, and polyimide.

Figure 10:
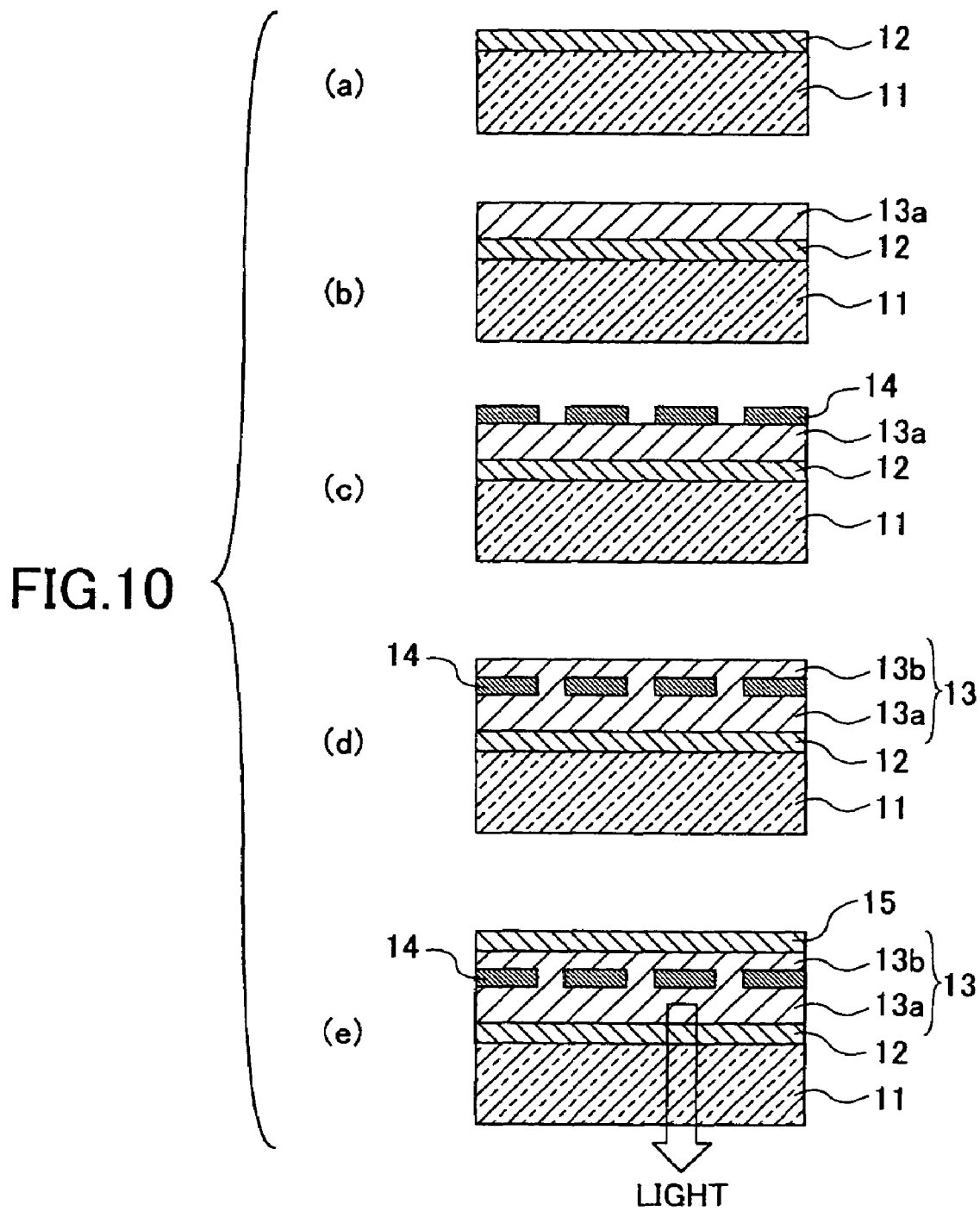
FIG. 10 is a manufacturing process drawing of the organic EL transistor of manufacturing embodiment 1 of the present invention.
Figure 11:
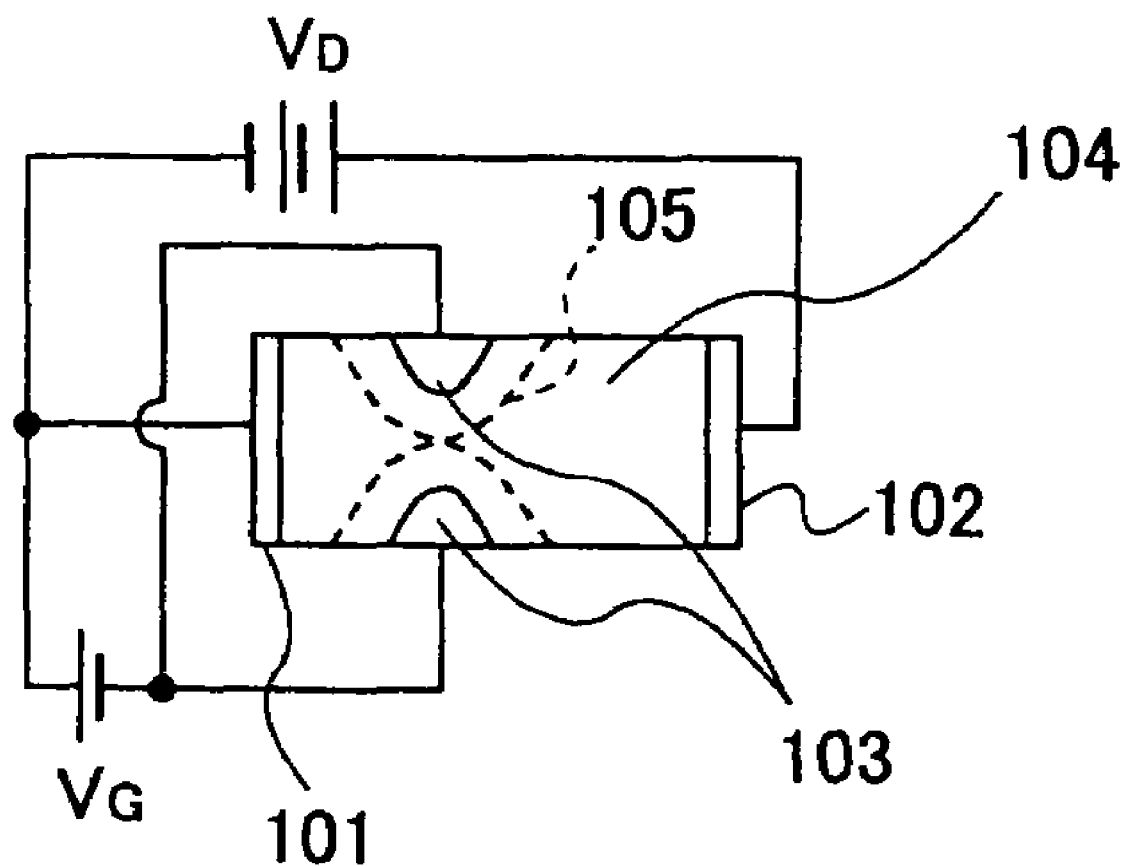
FIG. 11 is an outline sectional drawing of a SIT.

Example of a manufacturing process of the organic EL transistor of the present invention:

The organic EL transistor of the present invention (FIG. 2) is manufactured through a process as shown in FIG. 10. The processes that are performed in the following sequence include:

(1) process (a) for forming the drain electrode 12 of a transparent electrode material, such as ITO, on the upper surface of the transparent board 11, (2) process (b) for forming the first layer 13a of the organic semiconductor layer 13 by forming a film of an electric field (a p-type) luminescent organic semiconductor material on the upper surface of the drain electrode 12, (3) process (c) for forming the gate electrodes 14 in the shape of a comb, or a mesh, with an electrode material on the upper surface of the first layer 13a of the organic semiconductor layer 13, (4) process (d) for forming the second layer 13b of the organic semiconductor layer 13 by forming a film of the electric field (the p-type) luminescent organic semiconductor material on the upper surface of the first layer 13a of the semiconductor organic layer 13 and the gate electrodes 14, and (5) process (e) for forming the source electrode 15 by forming a film of an electrode material on the upper surface of the organic semiconductor layer 13 (that includes 13a and 13b).

In addition, although the example of manufacture of the organic EL transistor of the present invention is explained based on FIG. 2, the organic EL transistors shown in FIGS. 2 through 9 are manufactured in the same manner as above. Therefore, in this specification, in order to facilitate understanding of the manufacturing method of the organic EL transistors shown in FIGS. 2 through 9, the organic semiconductor layer is divided into two portions, each bearing a reference number suffixed by a and b, respectively, (for example, 23a and 23b in FIG. 3), in FIGS. 2 through 9.

MANUFACTURING EMBODIMENTS

Embodiment 1

(a) The drain electrode that is 1 micrometer thick was formed on the upper surface of a transparent glass substrate by sputtering a transparent electrode material consisting of ITO.

(b) A poly phenylenevinylene (PPV) solution, having viscosity of 20 CP, was prepared by dissolving PPV in a solvent consisting of xylene or chloroform, and the PPV solution was applied to the upper surface of the drain electrode by spin coating at a rotation speed of 500 rpm, such that a thin film that is about 1000 A thick was formed, which serves as a part of the (p-type) organic semiconductor layer.

(c) On the upper surface of this organic semiconductor layer, an aluminum thin film was formed by vacuum evaporation of aluminum, and comb-like gate electrodes were formed, using a metal mask formed in the comb shape.

(d) To the upper surface of the organic semiconductor layer and the comb-like gate electrodes, a spin coating of the PPV solution prepared in (b) above was performed at a rotation speed of 500 rpm, obtaining a thin film that is about 1000 A thick, and the remainder of the organic semiconductor layer was formed.

(e) Then, the source electrode that is 1 micrometer thick was formed by vacuum evaporation of an electrode material consisting of aluminum on the upper surface of the organic semiconductor layer, and the organic EL transistor (refer to the FIG. 2) was manufactured.

Embodiment 2

(a) The source electrode that is 1 micrometer thick was formed on the upper surface of a glass substrate by vacuum evaporation of an electrode material consisting of aluminum.

(b) A poly phenylenevinylene (PPV) solution, having viscosity of 20 CP, was prepared by dissolving PPV in a solvent consisting of xylene or chloroform, and the PPV solution was applied to the upper surface of the source electrode by spin coating at a rotation speed of 500 rpm, such that a thin film that is about 1000 Å thick was formed, which serves as a part of the (p-type) organic semiconductor layer.

(c) On the upper surface of this organic semiconductor layer, an aluminum thin film was formed by vacuum evaporation of aluminum, and the comb-like gate electrodes were formed, using a metal mask formed in the comb shape.

(d) To the upper surface of the organic semiconductor layer and the comb-like gate electrodes, a spin coating of the PPV solution prepared in (b) above was performed at a rotation speed of 500 rpm, obtaining a thin film that is about 1000 Å thick, and the remainder of the organic semiconductor layer was formed.

(e) Then, the drain electrode that is 1 micrometer thick was formed by vacuum evaporation of a transparent electrode material consisting of ITO on the upper surface of the organic semiconductor layer, and the organic EL transistor (refer to FIG. 3) was manufactured.

Embodiment 3

(a) The drain electrode that is 1 micrometer thick was formed on the back surface of a Si substrate that was highly doped with boron (B) or phosphor (P), having a low resistance characteristic, by vacuum evaporation of an electrode material consisting of aluminum.

(b) A poly phenylenevinylene (PPV) solution, having viscosity of 20 CP, was prepared by dissolving PPV in a solvent consisting of xylene or chloroform, and the PPV solution was applied to the upper surface of the Si substrate by spin coating at a rotation speed of 500 rpm, such that a thin film that is about 1000 Å thick was formed, which serves as a part of the (n-type) organic semiconductor layer.

(c) On the upper surface of this organic semiconductor layer, an aluminum thin film was formed by vacuum evaporation of aluminum, and the comb-like gate electrodes were formed, using a metal mask formed in the comb shape.

(d) To the upper surface of the organic semiconductor layer and the comb-like gate electrodes, a spin coating of the PPV solution prepared in (b) above was performed at a rotation speed of 500 rpm, obtaining a thin film that is about 1000 Å thick, and the remainder of the organic semiconductor layer was formed.

(e) Then, the source electrode that is 1 micrometer thick was formed by vacuum evaporation of a transparent electrode material consisting of ITO on the upper surface of the organic semiconductor layer, and the organic EL transistor (refer to FIG. 4) was manufactured.

Embodiment 4

(a) The drain electrode that is 1 micrometer thick was formed on the upper surface of the transparent glass substrate by sputtering a transparent electrode material consisting of ITO.

(b) A PEDOT solution was made by dissolving PEDOT in xylene. The electron hole injecting layer that is about 200 Å thick was formed by spin coating the PEDOT solution on the upper surface of the drain electrode.

(c) A poly phenylenevinylene (PPV) solution, having viscosity of 20 CP, was prepared by dissolving. PPV in a solvent consisting of xylene or chloroform, and the PPV solution was applied to the upper surface of the electron hole injecting layer by spin coating at a rotation speed of 500 rpm, such that a thin film that is about 1000 Å thick was formed, which serves as a part of the (p-type) organic semiconductor layer.

(d) On the upper surface of this organic semiconductor layer, an aluminum thin film was formed by vacuum evaporation of aluminum, and comb-like gate electrodes were formed, using a metal mask formed in the comb shape.

(e) To the upper surface of the organic semiconductor layer and the comb-like gate electrodes, a spin coating of the PPV solution prepared in (c) above was performed at a rotation speed of 500 rpm, obtaining a thin film that is about 1000 Å thick, and the remainder of the organic semiconductor layer was formed.

(f) Then, the source electrode that is 1 micrometer thick was formed by vacuum evaporation of an electrode material consisting of aluminum on the upper surface of the organic semiconductor layer, and the organic EL transistor (refer to FIG. 5) was manufactured.

Embodiment 5

(a) The source electrode that is 1 micrometer thick was formed on the upper surface of the glass substrate by vacuum evaporation of an electrode material consisting of aluminum.

(b) A poly phenylenevinylene (PPV) solution, having viscosity of 20 CP, was prepared by dissolving PPV in a solvent consisting of xylene or chloroform, and the PPV solution was applied to the upper surface of the source electrode by spin coating at a rotation speed of 500 rpm, such that a thin film that is about 1000 Å thick was formed, which serves as a part of the (p-type) organic semiconductor layer.

(c) On the upper surface of this organic semiconductor layer, an aluminum thin film was formed by vacuum evaporation of aluminum, and comb-like gate electrodes were formed, using a metal mask formed in the comb shape.

(d) To the upper surface of the organic semiconductor layer and the comb-like gate electrodes, a spin coating of the PPV solution prepared in (b) above was performed at a rotation speed of 500 rpm, obtaining a thin film that is about 1000 Å thick, and the remainder of the organic semiconductor layer was formed.

(e) A PEDOT solution was made by dissolving PEDOT in xylene. The electron hole injecting layer that is about 200 Å thick was formed by spin coating the PEDOT solution on the upper surface of the organic semiconductor layer.

(f) Then, the drain electrode that is 1 micrometer thick was formed by sputtering a transparent electrode material consisting of ITO on the upper surface of the electron hole injection layer, and the organic EL transistor (refer to FIG. 6) was manufactured.

Embodiment 6

(a) The drain electrode that is 1 micrometer thick was formed on the upper surface of the transparent glass substrate by sputtering a transparent electrode material that consisted of ITO.

(b) PEDOT was solved in xylene. The electron hole injecting layer that is about 200 Å thick was formed by spin coating this PEDOT solution on the upper surface of the drain electrode.

(c) A poly phenylenevinylene (PPV) solution, having viscosity of 20 CP, was prepared by dissolving PPV in a solvent consisting of xylene or chloroform, and the PPV solution was applied to the upper surface of the electron hole injecting layer by spin coating at a rotation speed of 500 rpm, such that a thin film that is about 1000 A thick was formed, which serves as a part of the (p-type) organic semiconductor layer.

(d) On the upper surface of this organic semiconductor layer, an aluminum thin film was formed by vacuum evaporation of aluminum, and comb-like gate electrodes were formed, using a metal mask formed in the comb shape.

(e) To the upper surface of the organic semiconductor layer and the comb-like gate electrodes, a spin coating of the PPV solution prepared in (c) above was performed at a rotation speed of 500 rpm, obtaining a thin film that is about 1000 A thick, and the remainder of the organic semiconductor layer was formed.

(f) A poly phenylenevinylene (PPV) solution, having viscosity of 20 CP, was prepared by dissolving PPV of the cyano group in a solvent consisting of xylene or chloroform. The electron injecting layer that is about 200 A thick was formed by spin coating the PPV solution on the upper surface of the organic semiconductor layer.

(g) Then, the source electrode that is 1 micrometer thick was formed by vacuum evaporation of an electrode material consisting of Al on the upper surface of the electron injecting layer, and the organic EL transistor (refer to FIG. 7) was manufactured.

Embodiment 7

(a) The source electrode that is 1 micrometer thick was formed on the upper surface of the glass substrate by vacuum evaporation of an electrode material that consisted of aluminum.

(b) PEDOT was dissolved in xylene. The electron hole injecting layer that is about 200 A thick was formed by spin coating this PEDOT solution on the upper surface of the source electrode.

(c) A poly phenylenevinylene (PPV) solution, having viscosity of 20 CP, was prepared by dissolving PPV in the solvent that consisted of xylene or chloroform. Then, this PPV solution was spin-coated at a rotation speed of 500 rpm on the upper surface of the electron hole injecting layer, and a thin film that is about 1000 A thick was formed, which serves a part of the organic semiconductor layer.

(d) On the upper surface of this organic semiconductor layer, the comb-like gate electrodes were formed by vacuum evaporation of aluminum, using a metal mask formed in the comb shape.

(e) The remainder of an organic semiconductor layer that is about 1000 A thick was formed by spin coating the PPV solution that was prepared in (c) above at a rotation speed of 500 rpm on the upper surface of the organic semiconductor layer and the gate electrodes.

(f) A PPV solution, having viscosity of 20 CP, was prepared by dissolving PPV of the cyano group in a solvent that consisted of xylene or chloroform. Then, the electron injecting layer that is about 200 A thick was formed by spin coating this PPV solution on the upper surface of the organic semiconductor layer.

(g) Then, the drain electrode that is 1 micrometer thick was formed by sputtering a transparent electrode material that consisted of ITO on the upper surface of the electron injecting layer, and the organic EL transistor (refer to FIG. 8) was manufactured.

Embodiment 8

(a) The source electrode that is 1 micrometer thick was formed on the back surface of a Si substrate that was highly doped with boron (B) or phosphor (P), having a low resistance characteristic, by vacuum evaporation of an electrode material that consisted of aluminum.

(b) A PPV solution, having viscosity of 20 CP, was prepared by dissolving poly phenylenevinylene (PPV) in a solvent that consisted of xylene or chloroform. Then, this PPV solution was spin-coated at a rotation speed of 500 rpm on the upper surface of the Si substrate such that a thin film that is about 1000 A thick was formed, which serves a part of the organic semiconductor layer.

(c) The comb-like gate electrodes were formed by vacuum evaporation of aluminum on the upper surface of this organic semiconductor layer, using a metal mask formed in the comb shape.

(d) The remainder of the organic semiconductor layer was formed by spin-coating the PPV solution that was prepared in (b) above to the upper surface of the organic semiconductor layer and the gate electrodes, the spin-coating performed at a rotation speed of 500 rpm, and forming a thin film of about 1000 A thick.

(e) The drain electrode that is 1 micrometer thick was formed by sputtering a transparent electrode material that consisted of ITO on the upper surface of the organic semiconductor layer, and the organic EL transistor (refer to FIG. 9) was manufactured.

(Effect of the Invention)

(1) Since the vertical type organic EL transistor 10 (FIG. 1) of the present invention provides a simple structure wherein an organic LED and an organic transistor are compounded, (i) operating resistance is made low by making the channel length short in reference to the film thickness, the channel being the current path of the organic EL transistor, hence operating speed is raised, (ii) the whole electrode surface is used effectively such that large electric power can be handled, while raising the operating speed, (iii) a high definition full color organic EL display of high luminescence efficiency is available, and (iv) production costs can be reduced. Further, according to the present invention, the gate electrodes in the organic semiconductor layer are shaped like a comb or a mesh, ON/OFF ratio of the transistor becomes greater, realizing a SIT with the normally-ON characteristic.

(2) Further, according to the present invention, the organic EL transistor is capable of the switching function and the luminescence function, and for that reason, the overall structure of the organic EL transistor can be miniaturized, enabling the adoption of simple thin-film manufacturing processes such as vacuum evaporation and painting, which reduces manufacturing cost.

(3) Further, according to the present invention, since the organic EL transistor has an electron hole injecting layer, (i) there is no carrier injection from the gate, which raises the operating speed, (ii) there is no current concentration, which makes ruggedness higher (larger current can be passed), (iii) the device becomes a voltage driven device, and (iv) an unsaturated current voltage characteristic is obtained in a normally-ON type (a saturation current voltage characteristic is obtained in a normally-OFF type).

(4) Further, according to the present invention, since the organic EL transistor has an electron injecting layer, electron injection resistance can be made low and, for that reason, large electric power can be handled.

(5) Further, according to the present invention, contact resistance can be reduced and an electrical property can be improved.

(6) Further, according to the present invention, satisfactory optical permeability is obtained, and manufacturing is easy.

Further, the present invention is not limited to these embodiments, but various variations and modifications may be made without departing from the scope of the present invention.

The present application is based on Japanese priority application No. 2001-08514 filed on Dec., 17, 2001 with the Japanese Patent Office, the entire contents of which are hereby incorporated by reference.

What is claimed is:

1. An organic electroluminescent transistor comprising:
   a source electrode and a drain electrode, which counter each other;
   an organic semiconductor layer provided between the source electrode and the drain electrode; and
   a plurality of gate electrodes arranged in the organic semiconductor layer at prescribed intervals,
   wherein the organic semiconductor layer is formed of an electroluminescent organic semiconductor material,
   wherein the electroluminescent organic semiconductor material comprises at least one of:
   (1) at least one kind of acene molecule material chosen from naphthalene, anthracene, tetracene, pentacene, hexacene, and derivatives thereof,
   (2) at least one kind of pigment chosen from a phthalocyanine containing compound, an azo containing compound, a perylene containing compound, and derivatives thereof,
   (3) at least one kind of low molecular compound chosen from hydrazone compound, triphenylmethane compound, diphenyl methane compound, stilbene compound, aryl vinyl compound, pyrazoline compound, triphenylamine compound, triarylamine compound, and derivatives thereof, and
   (4) at least one kind of high molecular compound chosen from poly N-vinyl carbazole, halogenated poly N-vinyl carbazole, poly vinyl pyrene, poly vinyl anthracene, pyrene formaldehyde resin, ethyl carbazole formaldehyde resin, and denaturations thereof.

2. The organic transistor as claimed in claim 1, wherein the gate electrodes, the source electrode, and the drain electrode are made from at least one kind of material chosen from the group of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), tin (Sn), conductive poly aniline, conductive polypyrrole, conductive poly thiazyl, and conductive polymer.

3. The organic transistor as claimed in claim 1, wherein the thickness of the gate electrodes formed by an aluminum thin film is 10 nm or less, more preferably between 2 nm and 3 nm.

4. The organic transistor as claimed in claim 1, wherein the thickness of each of the source electrode and the drain electrode formed by a thin film is between 30 nm and 500 nm.

* * * * *